United States Patent
Yao et al.

(10) Patent No.: US 11,373,560 B2
(45) Date of Patent: Jun. 28, 2022

(54) ROLLABLE DISPLAY DEVICE

(71) Applicant: Shanghai Tianma Micro-Electronics Co., Ltd., Shanghai (CN)

(72) Inventors: Qijun Yao, Shanghai (CN); Qing Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 186 days.

(21) Appl. No.: 16/916,122

(22) Filed: Jun. 30, 2020

(65) Prior Publication Data
US 2020/0335017 A1    Oct. 22, 2020

(30) Foreign Application Priority Data

Apr. 30, 2020   (CN) .......................... 202010368338.8

(51) Int. Cl.
| | |
|---|---|
| G09F 9/30 | (2006.01) |
| G06F 1/16 | (2006.01) |
| H01L 51/52 | (2006.01) |
| H01L 33/44 | (2010.01) |

(52) U.S. Cl.
CPC ............ *G09F 9/301* (2013.01); *G06F 1/1652* (2013.01); *H01L 33/44* (2013.01); *H01L 51/5253* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,877,384 B2 * | 1/2018 | Lee | ........................ | G06F 1/1652 |
| 10,321,584 B2 * | 6/2019 | Choi | .................... | H05K 5/0017 |
| 10,426,046 B2 * | 9/2019 | Hayk | ................... | H05K 5/0217 |
| 10,455,710 B2 * | 10/2019 | Kim | ....................... | G06F 1/1652 |
| 10,617,017 B2 * | 4/2020 | Park | ..................... | H05K 5/0217 |

(Continued)

FOREIGN PATENT DOCUMENTS

| | | | |
|---|---|---|---|
| CN | 107342018 A | | 11/2017 |
| CN | 108062913 A | | 5/2018 |

(Continued)

OTHER PUBLICATIONS

Office Action of CN Patent Application No. 202010368338.8 dated Jul. 26, 2021.

*Primary Examiner* — Lisa Lea-Edmonds
(74) *Attorney, Agent, or Firm* — Kilpatrick Townsend & Stockton, LLP

(57) ABSTRACT

A rollable display device including a rollable display module is provided. The rollable display module includes a hard film group and a flexible film group that are stacked, the hard film group has a greater overall Young's modulus than the flexible film group, and the rollable display device has a rolled state and an unrolled state; the hard film group includes a first surface facing away from the flexible film group in the unrolled state; the rollable display module is rolled towards the first surface in the rolled state; a minimum thickness of the flexible film group is D1, a thickness of the hard film group is D2, and $D1/(D1+D2) > \pi n/M$, where n is a positive number that represents a preset number of rolling turns of the rollable display module, and M represents a failure strain of the flexible film group under a shearing stress.

18 Claims, 7 Drawing Sheets

(56) References Cited

U.S. PATENT DOCUMENTS

| | | | | |
|---|---|---|---|---|
| 10,667,417 B2* | 5/2020 | Choi | ................... | H01L 51/5237 |
| 10,694,625 B2* | 6/2020 | Park | ..................... | H01L 51/524 |
| 11,013,130 B2* | 5/2021 | Shin | ................. | G02F 1/133305 |
| 11,056,025 B2* | 7/2021 | Lee | ................... | G02F 1/133305 |
| 11,089,699 B2* | 8/2021 | Park | ..................... | H01L 51/524 |
| 11,089,700 B2* | 8/2021 | Kang | ................... | H05K 5/0017 |
| 11,116,091 B1* | 9/2021 | Zhang | ................. | H05K 5/0017 |
| 11,237,590 B2* | 2/2022 | Kim | ..................... | G06F 1/1626 |
| 2018/0341142 A1* | 11/2018 | Choi | ................... | H01L 27/3246 |
| 2019/0141843 A1* | 5/2019 | Park | ................... | H04M 1/0268 |
| 2020/0245477 A1* | 7/2020 | Park | ..................... | G06F 1/1652 |
| 2020/0321551 A1* | 10/2020 | Kim | ..................... | H05K 5/0086 |
| 2021/0065590 A1* | 3/2021 | Huang | ................. | H01L 27/156 |
| 2021/0090476 A1* | 3/2021 | Kang | ................. | H01L 51/5246 |

FOREIGN PATENT DOCUMENTS

| | | | |
|---|---|---|---|
| CN | 110322791 A | 10/2019 | |
| CN | 110718639 A | 1/2020 | |
| CN | 110992836 A | 4/2020 | |

\* cited by examiner

ROLLABLE DISPLAY DEVICE

CROSS-REFERENCE TO RELATED APPLICATIONS

The present application claims priority to Chinese Patent Application No. 202010368338.8, filed on Apr. 30, 2020, the content of which is incorporated herein by reference in its entirety.

FIELD

The present disclosure relates to the field of display technologies, and in particular, to a rollable display device.

BACKGROUND

With development of display technologies, rollable display devices have emerged in recent years. The rollable display device adopts a rollable display module, i.e., a flexible display module. When in use, the rollable display device is in an unrolled state and has a large display screen. When not in use, the rollable display device may be in a rolled state, and thus is easy to store and carry. Compared to the unrolled state, misalignment between different films of the rollable display module may occur in the rolled state due to rolling. As a result, an excessively large strain may be formed at a position where the films are bonded to each other. Therefore, the films may crack at an edge position, influencing reliability of performances of the device.

SUMMARY

The embodiments of the present disclosure provide a rollable display device, which can solve the problem that the films of the device crack in a rolling process to influence reliability of performances of the device.

An embodiment of the present disclosure provides a rollable display device including a rollable display module. The rollable display module includes a hard film group and a flexible film group that are stacked. The hard film group has a greater overall Young's modulus than the flexible film group. The rollable display device has a rolled state and an unrolled state. The hard film group comprises a first surface, the first surface being a surface of the hard film group facing away from the flexible film group in the unrolled state. The rollable display module is rolled towards the first surface in the rolled state. The flexible film group has a minimum thickness D1, the hard film group has a thickness D2, and $D1/(D1+D2) > \pi n/M$, where n is a positive number that represents a preset number of rolling turns of the rollable display module, and M represents a failure strain of the flexible film group under a shearing stress.

BRIEF DESCRIPTION OF DRAWINGS

Embodiments of the present disclosure are illustrated in the accompanying drawings. It should be noted that the drawings described below are merely part of the embodiments of the present disclosure.

DESCRIPTION OF EMBODIMENTS

Embodiments of the present disclosure are described in the following with reference to the accompanying drawings. It should be understood that the described embodiments are merely exemplary embodiments of the present disclosure, and the present disclosure is not limited thereto.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

The present disclosure provides a rollable display device. The rollable display device includes a rollable display module. Overall Young's moduli, thicknesses, and preset numbers of rolling turns of film groups in the rollable display module are particularly designed in such a manner that the stress in the rolling process is released through the flexible film group. Therefore, the risk of cracking of the films in the rolling process is reduced, and a reliability of performances of the device is improved. The implementation of the present disclosure will be described in details in the following embodiments.

Figure 1:
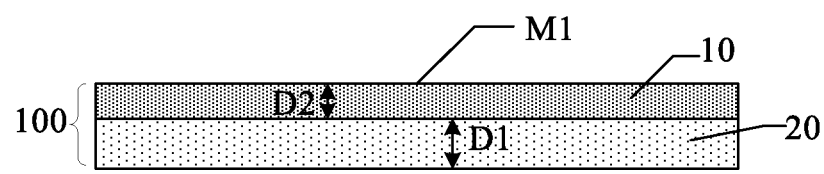
FIG. 1 is a schematic cross-sectional view of a rollable display device according to an embodiment of the present disclosure.
Figure 2:
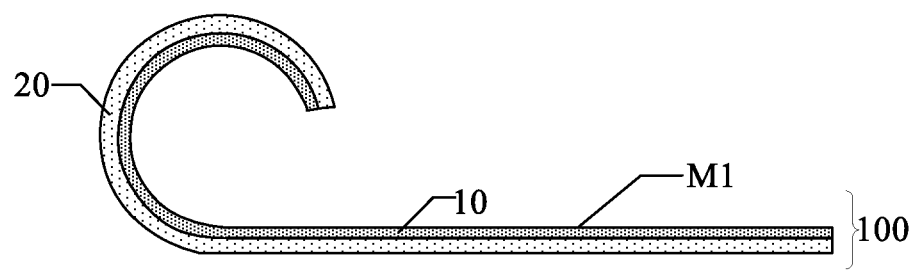
FIG. 2 is another schematic cross-sectional view of a rollable display device according to an embodiment of the present disclosure.
Figure 3:
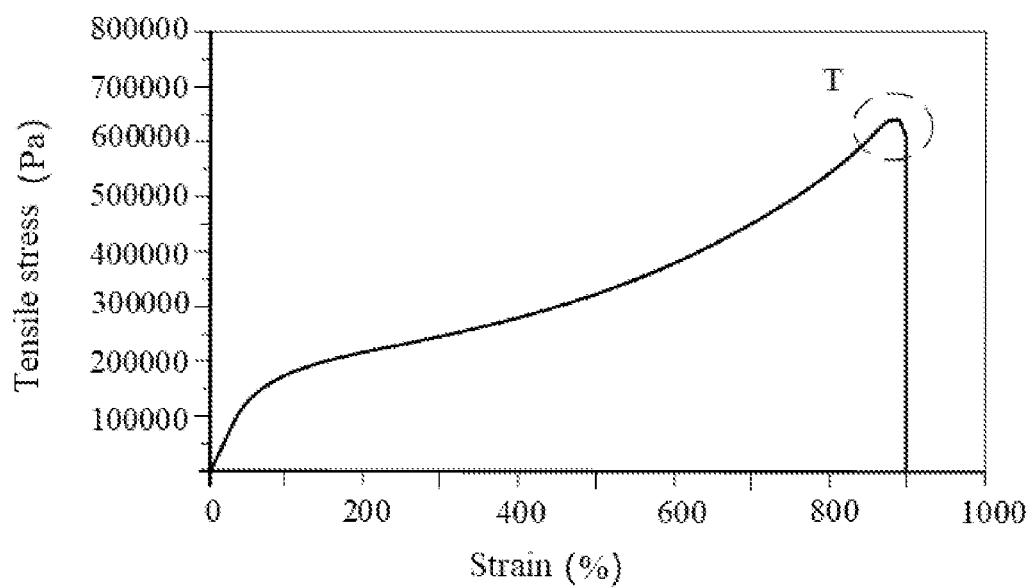
FIG. 3 is a diagram illustrating a tensile stress-strain curve of a material.

FIG. 1 is a schematic cross-sectional view of a rollable display device according to an embodiment of the present disclosure. FIG. 2 is another schematic cross-sectional view of a rollable display device according to an embodiment of the present disclosure. FIG. 3 is a diagram illustrating a tensile stress-strain curve of a material;

The rollable display device provided by this embodiment of the present disclosure includes a rollable display module, the rollable display device has a rolled state and an unrolled state, and the rollable display module also has a rolled state and an unrolled state. As shown in FIG. 1, a cross-sectional view of the rollable display device in the unrolled state is illustrated. The rollable display module 100 includes a hard film group 10 and a flexible film group 20 that are stacked on each other. An overall Young's modulus of the hard film group 10 is larger than an overall Young's modulus of the flexible film group 20. Here, the Young's modulus is also called a tensile modulus, which is a physical parameter representative of a capability of a solid material to resist deformation. That is, when stretched with a same force, the flexible film group 20 is more likely to deform than the hard film group 10. The hard film group 10 is a composite structure including one or more films. The overall Young's modulus of the hard film group 10 represents the Young's modulus of the entire hard film group. The flexible film group 20 may also be a composite structure including one or more films. The overall Young's modulus of the flexible film group 20 represents the Young's modulus of the entire flexible film group. In an embodiment, the overall Young's modulus of the hard mater group 10 is greater than 1 GPa, and the overall Young's modulus of the flexible film group 20 is smaller than 100 MPa. The hard film group 10 having an overall Young's modulus greater than 1 GPa can provide better support for the rollable display device. Meanwhile, since the overall Young's modulus of the flexible film group 20 is smaller than 100 MPa, it means that the overall Young's modulus of the hard film group 10 is larger than 10 times the overall Young's modulus of the flexible film group 20. In this case, the flexible film group 20 is more likely to deform during rolling, and thus the rolling stress can be better relieved.

As shown in FIG. 1, the hard film group 10 includes a first surface M1, and the first surface M1 is a surface facing away from the flexible film group 20 in the unrolled state. FIG. 2 is a schematic cross-sectional view of the rollable display module 100 in the rolled state. In the rolled state, the rollable display module 100 is rolled toward the first surface M1. That is, when being rolled, the hard film group 10 is disposed inside and the flexible film group 20 is disposed outside. When the rollable display module 100 is rolled toward the first surface M1, the flexible film group 20 disposed outside can wrap and protect the hard film group 10 in the rolled state. In this embodiment of the present disclosure, the rollable display device may include a rolling shaft, or may not include a rolling shaft. In other words, the rollable display module can be rolled according to a preset rolling radius in a case of no rolling shaft; or the rollable display module can be rolled onto a rolling shaft to achieve storage of the rollable display device. FIG. 2 illustrates the rolled state in a case of no rolling shaft.

In the unrolled state, in a direction perpendicular to the rollable display module, the flexible film group 20 may have approximately the same thickness at each position or may have different thicknesses at different positions, and the hard film group 10 has approximately the same thickness at each position. Here, a minimum thickness of flexible film group 20 is D1, and the thickness of the hard film group 10 is D2, where $D1/(D1+D2) > \pi n/M$, n is a preset number of rolling turns of the rollable display module 100, n is a positive number, and M is a failure strain of the flexible film group 20 under a shearing stress.

The preset number n of rolling turns may be an integer or a non-integer, such as 1.5, 1.8, etc. In other words, according to a length and a preset rolling radius of the rollable display module 100, the rollable display module 100 can be rolled an integer number of turns or a non-integer number of turns. The preset number n of rolling turns can be interpreted as a maximum number of turns that the entire rollable display module 100 has been rolled when the rollable display module 100 is rolled into the rolled state according to the preset rolling radius and a preset rolling manner. In addition, the rollable display module 100 in the unrolled state can be rolled into a rolled state having two implementation manners. According to one implementation manner, the rollable display module 100 is rolled from one end of the module, and in this case, the maximum number of rolling turns of the rollable display module 100 in the rolled state is the preset number n. According to the other implementation manner, the rollable display module 100 is rolled from two ends of the module, and in this case, the maximum number of rolling turns of the rollable display module 100 in the rolled state is a sum of the number of turns rolling from the two ends, that is, the sum of the numbers of turns rolling from the two ends is the preset number n of rolling turns.

When the module is bent, the flexible film group 20 is subjected to a shearing stress, and thus the flexible film group 20 correspondingly generates a strain. The strain herein refers to a degree of deformation of an object under an external force. All objects deform under an external force. If the deformation does not go beyond a certain limit, the deformation will disappear after the external force is removed, and this deformation is called an elastic deformation. If the external force is relatively large, the caused deformation goes beyond the limit, and the caused deformation does not completely disappear and residual deformation remains after the external force is removed. In other words, if the external force is relatively large, the deformation of the object cannot be recovered. As shown in FIG. 3, an abscissa represents a strain of a material (%), and an ordinate represents a tensile stress (Pa) applied to the material. As the stress applied thereto gradually increases, the strain of the material also gradually increases. When the stress reaches a certain value, the curve has an abrupt change point, i.e., the point A shown in FIG. 3, which is a fracture point of the material. That is, the abscissa (approximately 900%) at the point T represents a fracture strain, and the ordinate (approximately 60000 Pa) at the point T represents a fracture stress.

Figure 4:
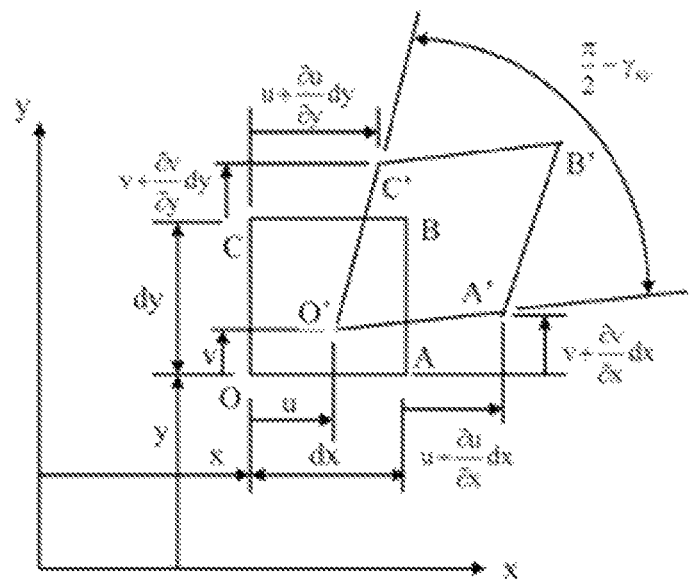
FIG. 4 is a schematic diagram illustrating a principle for calculating a shearing strain.

When an object deforms under a force, a degree of deformation is generally not the same at various points inside the object. A shearing strain represents a mechanical quantity of the degree of deformation at a point. FIG. 4 is a schematic diagram illustrating a principle for calculating a shearing strain. As shown in FIG. 4, a direction x and a direction y perpendicular to the direction x are illustrated. Before a material is stretched, a shape of the material is square AOCB, and after the material is stretched, the shape of the material is a diamond A'O'C'B'. Before deformation occurs, OA and OC are two lines perpendicular to each other at the point O. After deformation occurs by stretching, an angle between OA and OC at point O becomes ∠A'O'C'. According to the definition of the shearing strain, the shearing strain is a change of the angle between the mutual-perpendicular lines OA and OC. Then the shearing strain $\gamma_{xy}$ is calculated according to the following expression:

$$\gamma_{xy} = \lim_{\substack{dx \to 0 \\ dy \to 0}} \left(\frac{\pi}{2} - \angle A'O'C'\right) = \lim_{\substack{dx \to 0 \\ dy \to 0}} \left[\frac{\frac{\partial v}{\partial x}dx}{dx} + \frac{\frac{\partial u}{\partial y}dy}{dy}\right] = \frac{\partial v}{\partial x} + \frac{\partial u}{\partial y}.$$

In this embodiment of the present disclosure, the failure strain of the flexible film group 20, i.e., the fracture strain, can be interpreted as a limit strain that is bearable for the flexible film group 20. When the rollable display module 100 is bent, the flexible film group 20 is subjected to a shearing stress. When the strain of the flexible film group 20 under the shearing stress is greater than the failure strain M, breaking damage occurs to the flexible film group 20 when stretched under the shearing stress, thus causing cracks of films of the flexible film group 20 and the hard film group 10.

Figure 5:
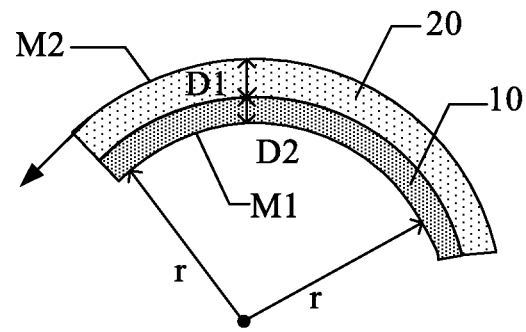
FIG. 5 is a schematic diagram illustrating a principle of release of the stress between the film groups in a rolled state.

FIG. 5 is a schematic diagram illustrating a principle of release of the stress between the film groups in the rolled state. As shown in FIG. 5, only a part of the flexible film group 20 and the hard film group 10 in the rolled state is shown in a simplified form. Taking the rollable display module that is rolled one turn as an example, the preset rolling radius is r. and since the rollable display module 100 is rolled toward a first surface M1, the first surface M1 is on an inner side while the flexible film group 20 is on an outer side, i.e., a surface of the flexible film group 20 facing away from the hard film group 10 is a second surface M2. In the cross-sectional view, when rolled one turn, a length of the outermost surface of the rollable display module (i.e., the second surface M2) is 2π*(r+D1+D2), and a length of the innermost surface of the rollable display module (i.e., the first surface M1) is 2πr. It can be seen that, there is a segmental gap 2π*(D1+D2) between the outermost surface (i.e., the outer side) and the innermost surface (i.e., the inner side) of the rollable display module. It should be noted that, the module described herein refers to the rollable display module, and the film group refers to the hard film group or the flexible film group. Since the strain caused by rolling is mainly absorbed by the flexible film group 20, the flexible film group 20 has a buffering effect on the segmental gap between the outermost surface and the innermost surface. Without considering a frictional force between the flexible film group 20 and the hard film group 10, the obtained segmental gap in length will be evenly distributed at two ends of the rollable display module, and a segmental gap at each of the two ends of the module is π*(D1+D2). Since the shearing strain is a ratio of a relative displacement between parallel sections to a vertical distance between the sections, the shearing strain of the flexible film group 20 at an edge of each of the two ends of the module is π*(D1+D2)/D1. Herein, the frictional force refers to a frictional force between the film groups, i.e., a frictional force between a side of the flexible film group 20 facing the hard film group 10 and a side of the hard film group 10 facing the flexible film group 20 in the unrolled state. After manufacturing of the rollable display module is finished, the flexible film group 20 is bonded and fixed to the hard film group 10, and therefore, the frictional force between the film groups is approximately zero.

Based on the above description, when the preset number of rolling turns of the rollable display module is n, there is a segmental gap 2nπ*(D1+D2) between the outer side and the inner side of the module after the rollable display module is rolled n turns, so the shearing strain of the flexible film group 20 at the edge of each of the two ends of the module is nπ*(D1+D2)/D1. In order to prevent cracking of the films of the flexible film group 20 when subjected to excessive stress during rolling, it is required that nπ*(D1+D2)/D1<M. In other words, the shearing strain of each of the two ends of the flexible film group 20 is smaller than a failure strain M of the flexible film group 20, so D1/(D1+D2)>πn/M.

In an embodiment, a material of the flexible film group 20 includes a rubber material, and a strain of the rubber material is in a range from 400% to 1200%. Taking the failure strain M of the flexible film group 20 being 900% as an example, when the preset number n of rolling turns is 2, then D1/(D1+D2)>0.698. That is, a thickness of the flexible film group accounts for more than 69.8% of an overall thickness of the flexible film group and the hard film group. When the preset number n of rolling turns is 2.5, that is, when the rollable display module can be rolled two and a half turns, then D1/(D1+D2)>0.872. That is, the thickness of the flexible film group accounts for more than 87.2% of the overall thickness of the flexible film group and the hard film group. In other words, when the material of the flexible film group 20 is constant, as the preset number of rolling turns increases, the thickness of the flexible film group accounts for more percent of the overall thickness of the flexible film group and the hard film group. As the preset number of rolling turns increases, an overall shearing stress to be borne by the flexible film group increases, then the thickness of the flexible film group can be increased to disperse the shearing stress borne by the flexible film group, thereby preventing the strain of the flexible film group from reaching the failure strain during the rolling process.

The rollable display device provided by this embodiment of the present disclosure includes the rollable display module, and the rollable display module includes the flexible film group and the hard film group. The overall Young's modulus of the flexible film group is different from the overall Young's modulus of the hard film group. During the rolling process, the hard film group is rolled inward, and the flexible film group is on the outer side. Then at a same position, the rolling radius of the flexible film group is larger than the rolling radius of the hard film group, and the flexible film group with a smaller overall Young's modulus can release the tensile stress during the rolling process. Meanwhile, a percentage of the thickness of the flexible film group accounting for the overall thickness of the film groups is set to satisfy a certain relationship with the preset number of rolling turns and the failure strain of the flexible film group, and the shearing strain at the edge of the flexible film group is smaller than the failure strain when the rollable display module is rolled within the preset number of rolling turns. In this way, the situation that the strain of the edge of the flexible film group reaches the failure strain to cause crack of the films is avoided, and thus the reliability of the performances of display device is improved. In addition, in the rolled state, the flexible film group with a smaller overall Young's modulus located on the outer side can protect the overall module structure. In the unrolled state, the flexible film group can increase the overall thickness of the rollable display module, and thus can also support and protect the overall module.

In an embodiment, $D2 \leq D1 \leq 10*D2$. In this embodiment, the thickness of the flexible film group is larger than the thickness of the hard film group. In the rolled state, the flexible film group with a smaller overall Young's modulus located on the outer side can protect the overall module structure. In the unrolled state, the flexible film group can increase the overall thickness of the rollable display module, and thus can also support and protect the overall module. Meanwhile, the thickness of the flexible film group is smaller than 10 times the thickness of the hard film group, so the thickness of the flexible film group is not too large and the thus the overall thickness of the rollable display module is not too large to be disadvantageous to overall lightness and thinness of the display device. When the overall thickness of the rollable display module is large, in an embodiment including a rolling shaft, after an end of the rollable display module with the large thickness is fixed to the rolling shaft, a large thickness difference will be formed at a fixing position (i.e., a rolling start position); and when the rollable display module is rolled to the rolling start position, the large thickness difference may contact and rub the hard film group to cause damage to the hard film group. By setting the thickness of the flexible film group within a certain range, the contact damage to the hard film group is avoided while the shearing stress generated during rolling is buffered, avoiding cracking of the film groups.

Figure 6:
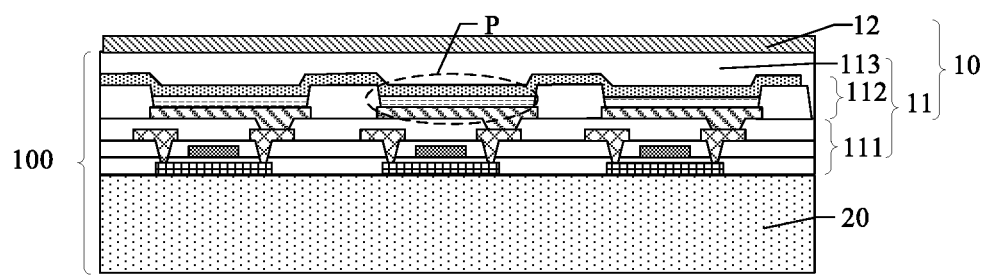
FIG. 6 is another schematic cross-sectional view of a rollable display device according to an embodiment of the present disclosure.

FIG. 6 is another schematic cross-sectional view of a rollable display device according to an embodiment of the present disclosure. FIG. 6 illustrates a cross-sectional view of a rollable display device in an unrolled state, in which the hard film group 10 includes a flexible display panel 11, and the flexible display panel 11 includes an array layer 111 and a light emitting element layer 112 that are stacked. The array layer 111 includes a plurality of thin film transistors (not labeled). In this embodiment, the hard film group includes the flexible display panel. In the unrolled state, the flexible film group can support and protect the flexible display panel, so that the rollable display module has an excellent unrolled state, thereby preventing rolling of the module due to inertia in the unrolled state. Meanwhile, in the rolled state, the flexible display panel is rolled to the inner side, the flexible film group is on the outer side, and the flexible film group can function to release the tensile stress in the rolling process, thereby avoiding damage to the flexible display panel caused by rolling and stretching. In addition, the thickness of the flexible film group satisfies a certain relationship with the preset number of rolling turns and the failure strain of the flexible film group, which ensures that the shearing strain at the edge of the flexible film group is smaller than the failure strain when the rollable display module is rolled within the preset number of rolling turns. In this way, the situation that the strain of the edge of the flexible film group reaches the failure strain to cause crack of the films is avoided, and thus the reliability of the performances of display device is improved.

With further reference to FIG. 6, the light emitting element layer 112 includes a plurality of light emitting elements P, and the light emitting elements P may be organic light emitting elements, each of which includes an anode, a light emitting layer, and a cathode that are sequentially stacked. FIG. 6 further illustrates an encapsulation layer 113 located on a side of the light emitting element layer 112 facing away from the array layer 111. The encapsulation layer 113 encapsulates and protects the light emitting element layer 112, to extend a service life of the light emitting device. In an embodiment, the encapsulation layer 113 is a thin film encapsulation, including at least one inorganic encapsulation layer and at least one organic encapsulation layer.

In an embodiment, the light emitting element layer of the flexible display panel includes a plurality of micro light emitting diodes. That is, the light emitting element P shown in FIG. 6 may be a micro light emitting diode. The micro light emitting diode includes a first electrode, a light emitting layer and a second electrode that are stacked in this order, and has advantages such as high efficiency, long service life and fast response.

With further reference to FIG. 6, the hard film group 10 further includes a protective layer 12 located on a side of the flexible display panel 11 facing away from the flexible film group 20. The protective layer 12 is bonded to the flexible display panel 11 by an adhesive-free bonding process. In the adhesive-free bonding process, the protective layer 12 is bonded to the flexible display panel 11 through direct contact with each other, During a manufacturing process, first, a surface of the protective layer that contacts the flexible display panel is modified, and/or a surface of the flexible display panel that contacts the protective layer is modified, then the protective layer and the flexible display panel are bonded together by a pressing process. Therefore, there is no need to provide an adhesive layer between the protective layer and the flexible display panel, which is advantageous to decreasing the overall thickness of the hard film group. According to the expression $D1/(D1+D2) > \pi n/M$ derived based on the principle described, when the preset number of rolling turns and the failure strain of the flexible film group are constant, decreasing the overall thickness of the hard film group is advantageous to increasing the percentage of the thickness of the flexible film group accounting for the overall thickness of the flexible film group and the hard film group, further ensuring that the shearing strain at the edge of the flexible film group is always smaller than the failure strain when the rollable display module is being rolled. In this way, the situation that the strain of the edge of the flexible film group reaches the failure strain to cause crack of the films is avoided, and thus the reliability of the performances of display device is improved.

Figure 7:
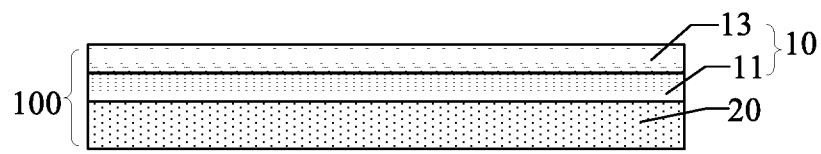
FIG. 7 is another schematic cross-sectional view of a rollable display device according to an embodiment of the present disclosure.

FIG. 7 is another schematic cross-sectional view of a rollable display device according to an embodiment of the present disclosure. FIG. 7 illustrates a cross-sectional view of the rollable display device in an unrolled state, in which the hard film group 10 further includes an anti-reflection layer 13 located on a side of the flexible display panel 11 facing away from the flexible film group 20. The anti-reflection layer is configured to prevent the rollable display module from reflecting ambient light to improve the display effect. In an embodiment, the anti-reflection layer includes a polarizer or a filter layer. In an embodiment including the filter layer, the filter layer further includes color resistance units and a black matrix. In the unrolled state, in a direction perpendicular to the flexible display panel, one color resistance unit overlaps with one light emitting element. In addition, in an embodiment, the light emitting elements in the light emitting element layer include red light emitting elements, green light emitting elements, and blue light emitting elements. The red light emitting element overlaps with a red color resistance unit, the green light emitting element overlaps with a green color resistance unit, and the blue light emitting element overlaps with a blue color resistance unit. In another embodiment, each of the light emitting elements in the light emitting element layer emits white light, and the corresponding color resistance units include red color resistance units, green color resistance units, and blue color resistance units. One light emitting element overlaps with the color resistance unit of one color.

In another embodiment, the flexible display panel further includes a touch layer located on a side of the light emitting element layer facing away from the flexible film group. The touch layer includes a plurality of metal grid-shaped touch electrodes. In the unrolled state, in the direction perpendicular to the flexible display panel, the black matrix overlaps with the metal grid-shaped touch electrodes. In other words, the black matrix covers the metal grid-shaped touch electrodes to shield the metal grid-shaped touch electrodes, preventing the metal from reflecting ambient light and causing the metal to be visible.

Figure 8:
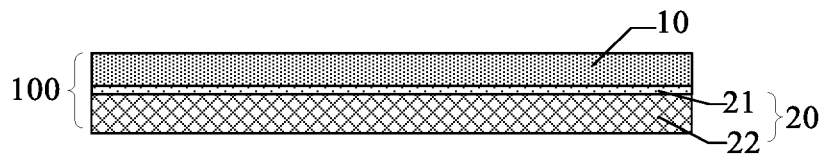
FIG. 8 is another schematic cross-sectional view of a rollable display device according to an embodiment of the present disclosure.

FIG. 8 is another schematic cross-sectional view of a rollable display device according to an embodiment of the present disclosure. FIG. 8 illustrates a cross-sectional view of the rollable display device in an unrolled state, in which the flexible film group 20 includes an adhesive layer 21 and a foam layer 22. The adhesive layer 21 is located between the hard film group 10 and the foam layer 22. The foam layer is adhered and fixed to the hard film group through the adhesive layer. The adhesive layer and the foam layer as a whole are used as a structure of the flexible film group used to release the bending stress suffered by the rollable display module when bending. The foam layer has a good effect of buffering stress. When the rollable display module is in a completely rolled state, the foam layer is the outermost layer that can protect the overall module structure. Moreover, when the preset number of rolling turns is greater than one, in the rolled state, a second surface of the flexible film group (the embodiments shown in FIG. 9 or FIG. 11 may be referred) will contact a first surface of the hard film group. When the foam layer contacts the first surface, a risk of damaging the surface of the hard film group due to contact friction then can be decreased.

Figure 9:
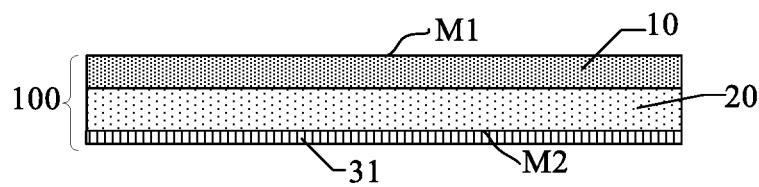
FIG. 9 is another schematic cross-sectional view of a rollable display device according to an embodiment of the present disclosure.
Figure 10:
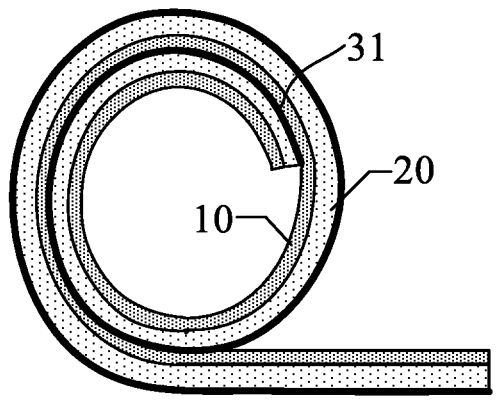
FIG. 10 is another schematic cross-sectional view of a rollable display device according to an embodiment of the present disclosure.

FIG. 9 is another schematic cross-sectional view of a rollable display device according to an embodiment of the present disclosure. FIG. 9 illustrates a cross-sectional view of the rollable display device in an unrolled state, in which the rollable display module 100 includes a smoothing structure, and the smoothing structure includes a first smoothing layer 31 located on a side of the flexible film group 20 facing away from the hard film group 10. Herein, the first smoothing layer may be a glass coating layer or a lubrication layer coated on a surface of the flexible film group 20 facing away from the hard film group 10. In the unrolled state shown in FIG. 9, the flexible film group 20 includes a second surface M2 away from the hard film group 10. FIG. 10 is still another schematic cross-sectional view of a rollable display device according to an embodiment of the present disclosure. In the rolled state shown in FIG. 10, in the rolled state, a contact frictional force between the first smoothing layer 31 (shown by a wide black line) and the first surface M1 is smaller than a first predicted contact frictional force. Herein, in a rolled state without the smoothing structure, a contact frictional force between the first surface M1 and the second surface M2 is the first predicted contact frictional force. In a case without the first smoothing layer, when the preset number of rolling turns is greater than one, the second surface of the flexible film group will contact the first surface of the hard film group in the rolled state. In the embodiment with the first smoothing layer, the first smoothing layer contacts the first surface during the rolling process, so that a contact frictional force between the first surface of the hard film group and other film layers during the rolling process can be decreased. In this way, a risk of damaging the surface of the hard film group due to contact friction then can be decreased, improving reliability of the performances of the rollable display device.

Figure 11:
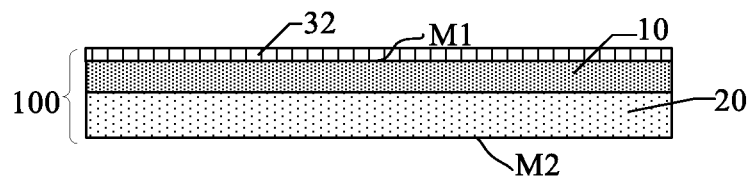
FIG. 11 is another schematic cross-sectional view of a rollable display device according to an embodiment of the present disclosure.
Figure 12:
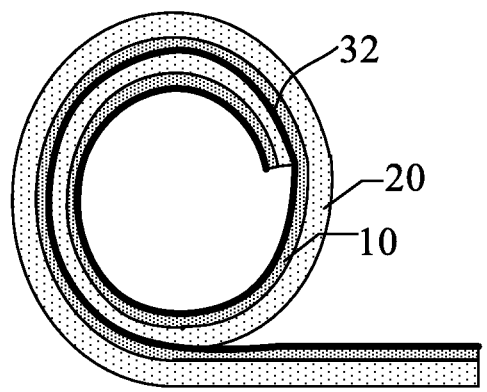
FIG. 12 is another schematic cross-sectional view of a rollable display device according to an embodiment of the present disclosure.

FIG. 11 is another schematic cross-sectional view of a rollable display device according to an embodiment of the present disclosure. FIG. 11 illustrates a cross-sectional view of the rollable display device in an unrolled state, in which the rollable display module 100 includes a smoothing structure, and the smoothing structure includes a second smoothing layer 32 located on a side of the hard film group 10 facing away from the flexible film group 20. In the unrolled state shown in FIG. 11, the flexible film group 20 includes a second surface M2 facing away from the hard film group 10. FIG. 12 is another schematic cross-sectional view of a rollable display device according to an embodiment of the present disclosure. In the rolled state shown in FIG. 12, the contact frictional force between the second smoothing layer 32 (shown by a wide black line) and the second surface M2 in the rolled state is smaller than a first predicted contact frictional force. Herein, in a rolled state without the smoothing structure, a contact frictional force between the first surface M1 and the second surface M2 is the first predicted contact friction force. In a case without the first smoothing layer, when the preset number of rolling turns is greater than one, the second surface of the flexible film group will contact the first surface of the hard film group in the rolled state. In the embodiment with the second smoothing layer, the second smoothing layer contacts the second surface during the rolling process, which can decrease a contact frictional force between the second surface of the flexible film group and other film layers during the rolling process. The second smoothing layer can protect the hard film group. Therefore, a risk of damaging the surface of the hard film group due to contact friction then can be decreased, improving reliability of the performances of the rollable display device.

Figure 13:
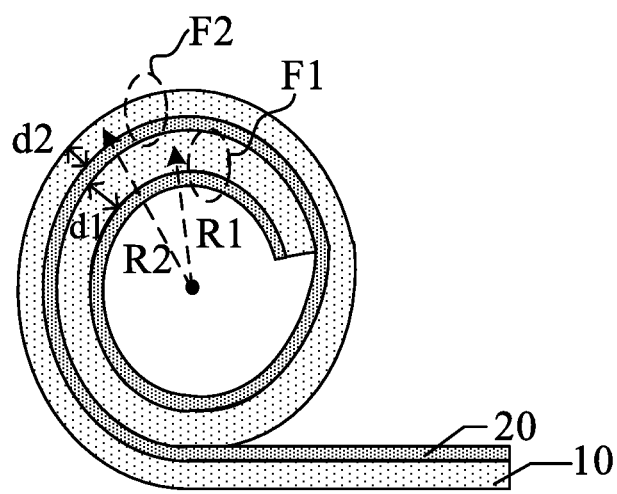
FIG. 13 is another schematic cross-sectional view of a rollable display device according to an embodiment of the present disclosure.

FIG. 13 is another schematic cross-sectional view of a rollable display device according to an embodiment of the present disclosure. FIG. 13 illustrates a cross-sectional view in a rolled state, in which the rollable display module at least includes a first preset rolled portion F1 and a second preset rolled portion F2. A bending radius R1 of the first preset rolled portion F1 is smaller than a bending radius R2 of the second preset rolled portion F2. A thickness of the flexible film group 20 in the first preset rolled portion F1 is d1, and a thickness of the flexible film group 20 in the second preset rolled portion F2 is d2, where d1>d2. As shown in the figure, in the rolled state, the first preset rolled portion F1 is located on an inner side of the second preset rolled portion F2. In this case, the rolling stress suffered by the first preset rolled portion F1 is greater than the rolling stress suffered by the second preset rolled portion F2. In this embodiment, d1>d2, and increasing the thickness of the flexible film group 20 in the first preset rolled portion F1 can increase the stress release capability of the flexible film group 20 in the first preset rolled portion F1, so that the stress at various positions in the rollable display module can be uniformly released. Therefore, cracks of the films caused by local bending due to local stress concentration can be avoided.

Figure 14:
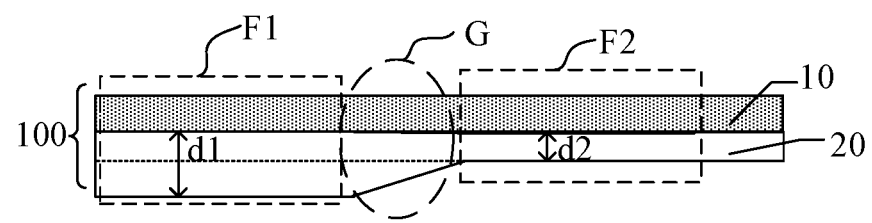
FIG. 14 is another schematic cross-sectional view of a rollable display device according to an embodiment of the present disclosure.
Figure 15:
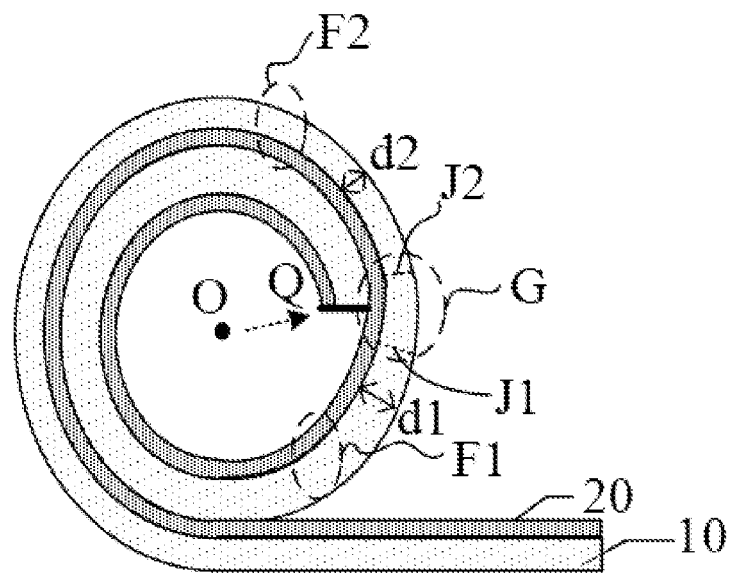
FIG. 15 is a schematic cross-sectional view of the rollable display device shown in FIG. 14 in a rolled state.

FIG. 14 is another schematic cross-sectional view of a rollable display device according to an embodiment of the present disclosure. FIG. 14 illustrates a cross-sectional view in an unrolled state, in which the rollable display module 100 includes a rolling start position Q, which is one end of the rollable display module 100. The rollable display module 100 further includes a rolling transition zone G. In the unrolled state, the rolling transition zone G is located between the first preset rolled portion F1 and the second preset rolled portion F2, the thickness of the flexible film group 20 in the first preset rolled portion F1 is d1, and the thickness of the flexible film group 20 in the second preset rolled portion F2 is d2. A dotted line is shown in FIG. 14, and this dotted line is substantially flush with an outer surface of the flexible film group 20 in the second preset rolled portion F2 facing away from the hard film group 10. As can be seen from the figure, the thickness of the flexible film group 20 in the first preset rolled portion F1 is larger than the thickness of the flexible film group 20 in the second preset rolled portion F2, and the thickness of the flexible film group 20 in the rolling transition zone G gradually changes. Along a direction pointing from the first preset rolled portion F1 to the second preset rolled portion F2, the thickness of the flexible film group 20 in the rolling transition zone G gradually decreases. FIG. 15 is a schematic cross-sectional view of the rollable display device shown in FIG. 14 in a rolled state. As shown in FIG. 15, in the rolled state, the rollable display module has a rolling axis. In a direction from the rolling axis O to the rolling start position Q, the rolling transition zone G overlaps with the rolling start position Q. Since the thickness of the flexible film group 20 in the first preset rolled portion F1 is larger than the thickness of the flexible film group 20 in the second preset rolled portion F2, the rolling transition zone G then can provide a uniform transition of the overall thickness of the module, thus avoiding an abrupt change in the thickness of the module. As shown in FIG. 15, the rollable display module has a certain film thickness, especially in an embodiment including the rolling shaft, there is a certain segmental gap between the start position of the rollable display module and the rolling shaft. If the thickness of the module changes abruptly from the first preset rolled portion F1 to the second preset rolled portion F2, then in the direction from the rolling axis O to the rolling start position Q, the abrupt change in the thickness of the module and the segmental gap (between the start position and the rolling shaft) are superposed. In this case, when the rollable display module is rolled to that position again, the hard film group is damaged easily. In an embodiment of the present disclosure as shown in FIG. 15, a boundary J1 (shown by a dotted line) between the first preset rolled portion F1 and the rolling transition zone G, and a boundary J2 (shown by a dotted line) between the second preset rolled portion F2 and the rolling transition zone G are illustrated. A zone between the boundary J1 and the boundary J2 is the rolling transition zone G. The thickness of the flexible film group 20 at the boundary J1 is d1, and the thickness of the flexible film group 20 at the boundary J2 is d2, where d1>d2. In the transition from the first preset rolled portion F1 to the second preset rolled portion F2, the thickness of flexible film group 20 gradually decreases in the rolling transition zone G. In this way, the rolling transition zone provides a uniform transition of the thickness, decreasing the risk of damaging the hard film group.

In this embodiment of the present disclosure, the rollable display device includes at least one rolling shaft, and at least one end of the rollable display module is fixedly connected to one of the at least one rolling shaft. In an embodiment, the rollable display module is fixedly connected to the rolling shaft through an adhesive layer. In an embodiment, the rollable display device includes only one rolling shaft, and one end of the rollable display module is fixedly connected to the rolling shaft, and in the rolled state, the rollable display module is completely rolled onto the rolling shaft. In another embodiment, the rollable display device includes two rolling shafts, and the two ends of the rollable display module are fixedly connected to the two rolling shaft, respectively; and in the rolled state, the rollable display module is rolled from the two ends, and thus each of the two rolling shafts has a part of the rollable display module rolled thereon. With the at least one rolling shaft provided in the rollable display device, the rollable display module can be rolled onto the rolling shaft for storage. As a solid structure, the rolling shaft can support the rollable display module in the rolled state. Moreover, the rolling radius in the rolled state is constant, so rolling can be easily implemented, and the rolled state is more stable.

Figure 16:
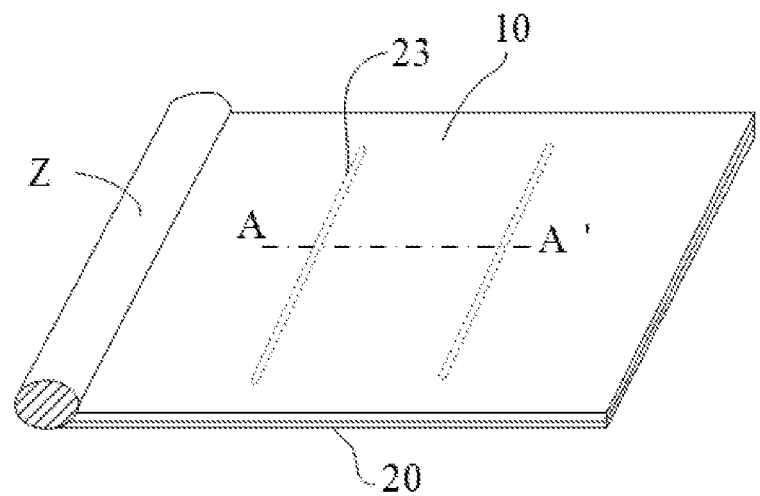
FIG. 16 is another schematic diagram of a rollable display device according to an embodiment of the present disclosure.
Figure 17:
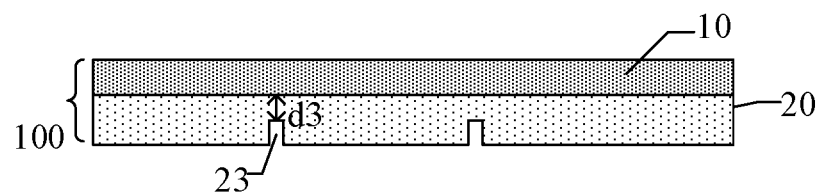
FIG. 17 is a schematic cross-sectional view at a line A-A' shown in FIG. 16.

FIG. 16 is another schematic diagram of a rollable display device according to an embodiment of the present disclosure. As shown in FIG. 16, the rollable display device includes one rolling shaft Z for illustration, and the flexible film group 20 includes at least one stress release groove 23. An extending direction of the stress release groove 23 is the same as an extending direction of the rolling shaft Z. In the extending direction of the stress release groove 23, the stress release groove 23 does not penetrate through the flexible film group 20. FIG. 17 is a schematic cross-sectional view along line A-A' shown in FIG. 16. As shown in FIG. 17, the stress release groove 23 does not penetrate through the flexible film group 20 in the thickness direction of the flexible film group 20. A thickness d3 of the flexible film group 20 at the stress release groove 23 is a minimum thickness D1 of the flexible film group 20. In the scheme with the flexible film group being provided with the stress release groove, $d3/(d3+D2) > \pi n/M$. That is, in this embodiment, the minimum thickness of the flexible film group also satisfies the expression in the embodiment of FIG. 1 described above. The percentage of the minimum thickness of the flexible film group accounting for the overall thickness of the film groups satisfies a certain relationship with the preset number of rolling turns and the failure strain of the flexible film group, so that when the rollable display module is rolled within the preset number of rolling turns, the shearing strain at the edge of the flexible film group is always smaller than the failure strain. In this way, the situation that the strain of the edge of the flexible film group reaches the failure strain to cause crack of the films is avoided, and thus the reliability of the performances of the display device is improved. In this embodiment, the stress release groove is an elongated slot in the flexible film group. In the rolling process, the stress release groove can release the rolling stress suffered by the flexible film group. The stress release groove does not penetrate through the flexible film group in the extending direction of the rolling shaft, thereby retaining an integrity of the flexible film group structure, and a release position of the rolling stress in the rolling process is still concentrated at two ends of the rollable display module.

Further, the hard film group includes a flexible display panel. The flexible display panel includes a plurality of light emitting areas and a non-light emitting area surrounding the light emitting areas. The light emitting areas correspond to the light emitting elements. In the unrolled state, the stress release groove overlaps with the non-light emitting area, that is, the stress release groove does not overlap with the light emitting elements. The thickness of the flexible film group at the stress release groove is thinner, while the flexible film group at the light emitting elements has a complete structure. Therefore, the flexible film group at the thicker positions can protect the light emitting elements. In addition, the stress release groove deforms to a certain degree due to release of the stress in the rolling process. The setting that the stress release groove does not overlap with the light emitting elements avoids the situation that large deformation adversely affects the light emitting elements. In addition, the deformation of the flexible film group at the edge of the rollable display module also overlaps the non-light emitting area in the rolling process; while in the unrolled state, the flexible film group at the position of the edge of the rollable display module overlaps with the non-light emitting area of the flexible display panel.

Figure 18:
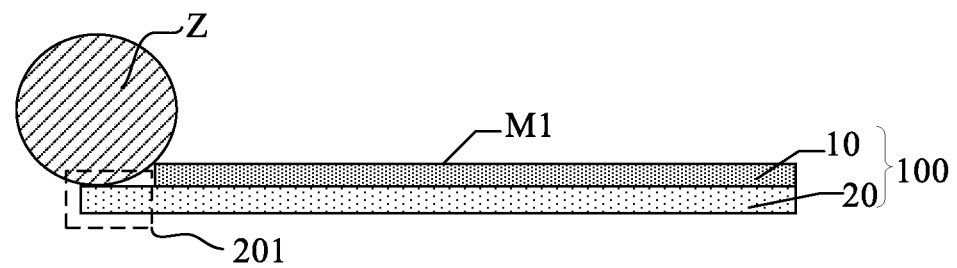
FIG. 18 is another schematic cross-sectional view of a rollable display device according to an embodiment of the present disclosure.

FIG. 18 is another schematic cross-sectional view of a rollable display device according to an embodiment of the present disclosure. As shown in FIG. 18, the rollable display device includes one rolling shaft Z for illustration. FIG. 18 illustrates a cross-sectional view in an unrolled state, in which the flexible film group 20 includes a first extending portion 201. At one end of the rollable display module 100, the flexible film group 20 extends beyond the hard film group 10, and the first extending portion 201 is fixedly connected to the rolling shaft Z. That is, at the rolling start position, only the flexible film group is connected to the rolling shaft, so that when the rollable display module 100 is rolled toward the first surface M1, the segmental gap between the rollable display module and the rolling shaft at the start position is decreased. In other words, only the flexible film group is connected to the rolling shaft at the start position, and the thickness of the rollable display module at the start position is relatively small. In this way, when the rollable display module is rolled one turn and reaches the start position again, the first surface of the hard film group is in contact with the small segmental gap, which decreases the risk of damaging the hard film group due to contact friction. In addition, the hard film group includes a flexible display panel for display, and the flexible film group mainly includes film layers for supporting and protecting. Therefore, in the case of the flexible film group being fixedly connected to the rolling shaft, there is no need to consider an accuracy of alignment of the hard film group with the rolling shaft (the fixing deviation of the alignment may influence the display effect). Therefore, the design of the rollable display module structure is simpler.

Figure 19:
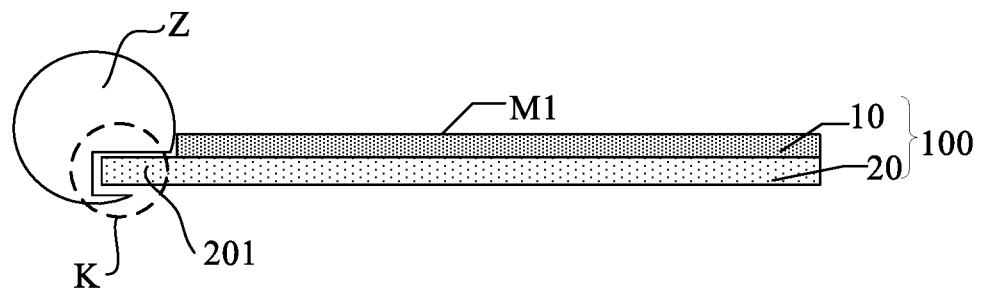
FIG. 19 is another schematic cross-sectional view of a rollable display device according to an embodiment of the present disclosure.

FIG. 19 is another schematic cross-sectional view of a rollable display device according to an embodiment of the present disclosure. FIG. 19 illustrates a cross-sectional view in an unrolled state, in which the rolling shaft Z includes a notch K, and the first extending portion 201 extends into the notch K to be fixedly connected to the rolling shaft Z. The rollable display module at the position where the rollable display module is fixedly connected to the rolling shaft can only be used for fixing and connection and cannot be used for display. This fixing position is hidden inside the notch. Therefore, when in use in the unrolled state, the rollable display device looks more aesthetic. Moreover, the segmental gap at the rolling start position can be decreased. When the rollable display module is rolled one turn and reaches the start position again, the first surface of the hard film group is in contact with a smaller segmental gap, which can decrease the risk of damaging the hard film group due to contact friction.

Figure 20:
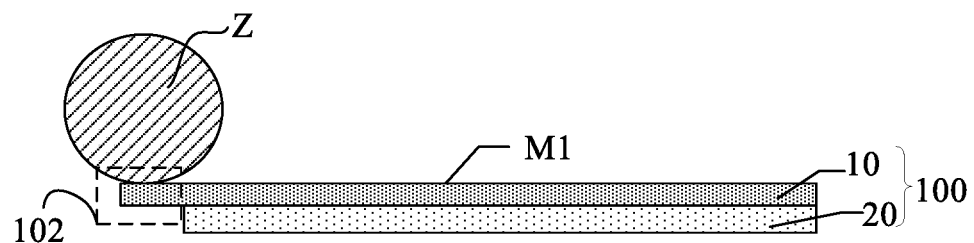
FIG. 20 is another schematic cross-sectional view of a rollable display device according to an embodiment of the present disclosure.

FIG. 20 is another schematic cross-sectional view of a rollable display device according to an embodiment of the present disclosure. FIG. 20 illustrates a cross-sectional view in an unrolled state, in which the hard film group 10 includes a second extending portion 102. At one end of the rollable display module 100, the hard film group 10 extends beyond the flexible film group 20, and the second extending portion 102 is fixedly connected to the rolling shaft Z. That is, at the rolling start position, only the hard film group is fixedly connected to the rolling shaft, so that when the rollable display module 100 is rolled toward the first surface M1, the segmental gap between the rollable display module and the rolling shaft at the start position is decreased. At the start position, only the hard film group is connected to the rolling shaft, and the thickness of the rollable display module at the start position is relatively small. When the rollable display module is rolled one turn and reaches the start position again, the first surface of the hard film group is in contact with the small segmental gap, Moreover, when being rolled for a second turn, the rollable display module is first spaced from the rolling shaft by only the thickness of the hard film group, and then as rolling continues, the rollable display module is spaced from the rolling shaft by the overall thickness of the hard film group and the flexible film group. In this way, a gradual transition is formed for the segmental gap during rolling, decreasing the risk of damaging the hard film group due to contact friction.

Figure 21:
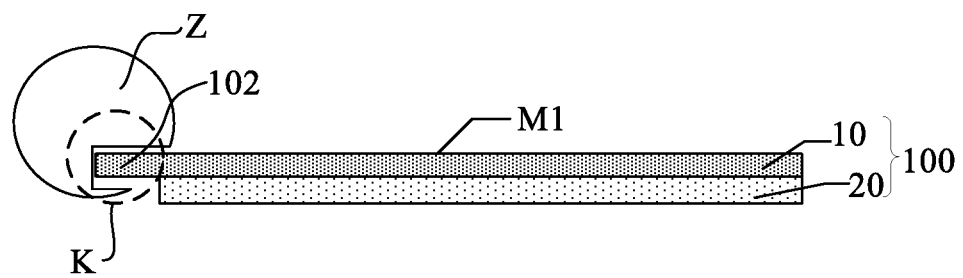
FIG. 21 is another schematic cross-sectional view of a rollable display device according to an embodiment of the present disclosure.

FIG. 21 is another schematic cross-sectional view of a rollable display device according to an embodiment of the present disclosure. FIG. 21 illustrates a cross-sectional view in an unrolled state, in which the rolling shaft Z includes a notch K, and the second extending portion 102 extends into the notch K to be fixedly connected to the rolling shaft. The rollable display module at the position where the rollable display module is fixed to the rolling shaft can only be used for fixing and connection and cannot be used for display. The fixation position is hidden inside the notch. Therefore, in the unrolled state, the rollable display device looks more aesthetic. Moreover, the segmental gap at the rolling start position is decreased. In this way, when the rollable display module is rolled one roll and reaches the start position again, the first surface of the hard film group is in contact with a smaller segmental gap, which can decrease the risk of damaging the hard film group due to contact friction. Further, the hard film group is used for display, and because the edge of the hard film group is hidden inside the notch, the edge of the hard film group can be protected.

Figure 22:
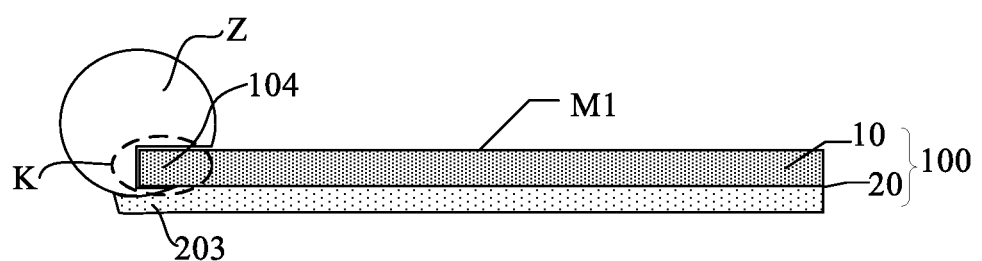
FIG. 22 is another schematic cross-sectional view of a rollable display device according to an embodiment of the present disclosure.

FIG. 22 is another schematic cross-sectional view of a rollable display device according to an embodiment of the present disclosure. FIG. 22 illustrates a cross-sectional view in an unrolled state, in which the flexible film group 20 includes a third extending portion 203, the hard film group 10 includes a fourth extending portion 104, and the rolling shaft Z includes a notch K. At one end of the rollable display module 100, the fourth extending portion 104 extends into the notch K to be fixedly connected to the rolling shaft Z, and the third extending portion 203 is fixedly connected to the rolling shaft Z at an outer side of the rolling shaft Z. In this embodiment, the flexible film group and the hard film group are fixedly connected to different positions of the rolling shaft, improving reliability of the connection and decreasing the risk of detachment and cracks at the fixing and connection position after rolling and unrolling for multiple times. Because the edge of the hard film group is hidden inside the notch, the edge of the hard film group can be protected. Moreover, when the rollable display module continues to be rolled around the rolling shaft after having been rolled a first turn, the rollable display module first contacts only the flexible film group, i.e., the rollable display module is spaced from the rolling shaft by the thickness of the flexible film group, and then as rolling continues, the spacing between the rollable display module and the rolling shaft becomes the overall thickness of the flexible film group and the hard film group after a gradual transition. In this way, a gradual transition is formed for the segmental gap during rolling, decreasing the risk of damaging the hard film group due to contact friction.

The embodiments described above with reference to FIG. 18 to FIG. 22 are illustrated as examples in which the rollable display device includes one rolling shaft, the embodiments in which the rollable display device includes two rolling turns can be understood with reference to the contents described above, and the details will not be further described herein. In addition, the shape of the rolling shaft is not limited in the embodiments of the present disclosure. In the embodiments described above, the cross-section of the rolling shaft has a circular shape, that is, the rolling shaft is a cylinder. However, it should be understood that, the rolling shaft may be a quadrangular prism or any other polygonal prism.

What is claimed is:

1. A rollable display device, comprising a rollable display module,
   wherein the rollable display module comprises a hard film group and a flexible film group that are stacked,
   wherein the hard film group has a greater overall Young's modulus than the flexible film group,
   wherein the rollable display device has a rolled state and an unrolled state,
   wherein the hard film group comprises a first surface, the first surface being a surface of the hard film group facing away from the flexible film group in the unrolled state; and the rollable display module is rolled towards the first surface in the rolled state, and
   wherein the flexible film group has a minimum thickness $D1$, the hard film group has a thickness $D2$, and $D1/(D1+D2) > \pi n/M$, where n is a positive number that represents a preset number of rolling turns of the rollable display module, and M represents a failure strain of the flexible film group under a shearing stress.

2. The rollable display device according to claim 1, wherein the hard film group comprises a flexible display panel, wherein the flexible display panel comprises an array layer and a light emitting element layer that are stacked.

3. The rollable display device according to claim 2, wherein the hard film group further comprises an anti-reflection layer located at a side of the flexible display panel facing away from the flexible film group.

4. The rollable display device according to claim 2, wherein the hard film group further comprises a protective layer located at a side of the flexible display panel facing away from the flexible film group, and the protective layer is bonded to the flexible display panel by an adhesive-free bonding process.

5. The rollable display device according to claim 2, wherein the light emitting element layer comprises a plurality of organic light emitting elements or a plurality of micro light emitting diodes.

6. The rollable display device according to claim 1, wherein the flexible film group comprises an adhesive layer and a foam layer, and the adhesive layer is located between the hard film group and the foam layer.

7. The rollable display device according to claim 1, wherein $D2 \leq D1 \leq 10\ D2$.

8. The rollable display device according to claim 1, wherein
   the rollable display module further comprises a smoothing structure, wherein the smoothing structure comprises a first smoothing layer located at a side of the flexible film group facing away from the hard film group;
   the flexible film group comprises a second surface, the second surface being a surface of the flexible film group facing away from the hard film group in the unrolled state; and
   in the rolled state, a contact frictional force between the first smoothing layer and the first surface is smaller than a first predicted contact frictional force, which is a contact frictional force between the first surface and the second surface in the rolled state without the smoothing structure.

9. The rollable display device according to claim 1, wherein
   the rollable display module further comprises a smoothing structure, wherein the smoothing structure comprises a second smoothing layer located at a side of the hard film group facing away from the flexible film group;
   the flexible film group comprises a second surface, the second surface being a surface of the flexible film group facing away from the hard film group in the unrolled state;
   in the rolled state, a contact frictional force between the second smoothing layer and the second surface is smaller than a first predicted contact frictional force, which is a contact frictional force between the first surface and the second surface in the rolled state without the smoothing structure.

10. The rollable display device according to claim 1, wherein
    the rollable display module at least comprises a first preset rolled portion and a second preset rolled portion, and the first preset rolled portion has a smaller rolling radius than the second preset rolled portion; and
    a thickness of the flexible film group in the first preset rolled portion is $d1$, and a thickness of the flexible film group in the second preset rolled portion is $d2$, where $d1 > d2$.

11. The rollable display device according to claim 10, wherein
    the rollable display module comprises a rolling start position, the rolling start position being an end of the rollable display module;
    the rolling display module further comprises a rolling transition zone, and in the unrolled state, the rolling transition zone is located between the first preset rolled portion and the second preset rolled portion, and a thickness of the flexible film group in the rolling transition zone gradually changes; and
    in the rolled state, the rollable display module has a rolling axis, and the rolling transition zone overlaps with the rolling start position in a direction from the rolling axis to the rolling start position.

12. The rollable display device according to claim 1, further comprising at least one rolling shaft, wherein at least one end of the rollable display module is fixedly connected to one of the at least one rolling shaft.

13. The rollable display device according to claim 12, wherein the flexible film group comprises at least one stress release groove, an extending direction of each of the at least one stress release groove is identical with an extending direction of the at least one rolling shaft, and in the extending direction of the stress release groove, the stress release groove does not penetrate through the flexible film group.

14. The rollable display device according to claim 12, wherein the flexible film group comprises a first extending portion, and at the at least one end of the rollable display module, the first extending portion extends beyond the hard film group, and the first extending portion is fixedly connected to the one of the at least one rolling shaft.

15. The rollable display device according to claim 14, wherein the one of the at least one rolling shaft comprises a notch, and the first extending portion extends into the notch to be fixedly connected to the one of the at least one rolling shaft.

16. The rollable display device according to claim 12, wherein the hard film group comprises a second extending portion, and at the at least one end of the rollable display module, the second extending portion extends beyond the flexible film group, and the second extending portion is fixedly connected to the one of the at least one rolling shaft.

17. The rollable display device according to claim 16, wherein the one of the at least one rolling shaft comprises a notch, and the second extending portion extends into the notch to be fixedly connected to the one of the at least one rolling shaft.

18. The rollable display device according to claim 12, wherein
- the flexible film group comprises a third extending portion, and the hard film group comprises a fourth extending portion;
- the one of the at least one rolling shaft comprises a notch; and
- at the at least one end of the rollable display module, the fourth extending portion extends into the notch to be fixedly connected to the one of the at least one rolling shaft, and the third extending portion is fixedly connected to the one of the at least one rolling shaft at an outer side thereof.

* * * * *